United States Patent [19]
Wakamatsu

[11] Patent Number: 5,854,635
[45] Date of Patent: Dec. 29, 1998

[54] VIDEO STORAGE DEVICE

[75] Inventor: Masataka Wakamatsu, Kanagawa, Japan

[73] Assignee: Sony Corporation, Tokyo, Japan

[21] Appl. No.: 768,414

[22] Filed: Dec. 18, 1996

Related U.S. Application Data

[63] Continuation of Ser. No. 429,437, Apr. 27, 1995, abandoned, which is a continuation of Ser. No. 75,261, Jun. 11, 1993, abandoned.

[30] Foreign Application Priority Data

Jun. 15, 1992 [JP] Japan ................................. 4-181815

[51] Int. Cl.$^6$ .................................................. G09G 5/00
[52] U.S. Cl. ...................... 345/507; 345/197; 365/189.04
[58] Field of Search ...................................... 345/185, 197, 345/507; 395/164; 248/209, 909, 335, 160, 183; 365/189.04, 22; 377/56, 26

[56] References Cited

U.S. PATENT DOCUMENTS

| | | | |
|---|---|---|---|
| 4,688,032 | 8/1987 | Saito et al. ................................. | 345/185 |
| 4,779,080 | 10/1988 | Coughlin et al. ........................ | 345/185 |
| 4,982,279 | 1/1991 | Ishii et al. ................................. | 358/160 |
| 4,989,183 | 1/1991 | Kumanoya et al. ................ | 365/189.04 |
| 5,016,107 | 5/1991 | Sasson et al. ............................ | 358/209 |
| 5,218,673 | 6/1993 | Fujiwara ................................. | 345/185 |
| 5,440,718 | 8/1995 | Kumagai et al. ........................ | 395/164 |

*Primary Examiner*—Amare Mengistu
*Attorney, Agent, or Firm*—Pasquale Musacchio; Jerry A. Miller

[57] ABSTRACT

A video storage device capable of realizing a still image-holding mode. The storage device has a serial input-output configuration. A serial input register is connected with a memory array via a transfer gate circuit which selectively permits transfer of data from the serial input register to the memory array. An address counter is connected with the serial input register. In the still image-holding mode, the transfer gate circuit is disabled, and the memory array is accessed in response to counting operation of the address counter. The address counter acts also as a refreshing counter for refreshing the memory array.

4 Claims, 4 Drawing Sheets

VIDEO STORAGE DEVICE

This is a continuation of Ser. No. 08/429.437 filed on Apr. 27, 1995 which is now abandoned and Ser. No. 08/075,261 filed on Jun. 11, 1993 which is now abandoned.

BACKGROUND OF THE INVENTION

The present invention relates to a video storage device and, more particularly, to a video storage device having a serial input-output configuration.

In a video storage device used in processing of images such as in TVs or VTRs, it is customary to continuously write or read data to or from the storage device. Therefore, each memory cell is not required to be refreshed. However, where video data is accepted as a still image and held, such a refreshing operation is needed. In particular, where all accepted data are read out and successively displayed, no problem occurs, because the reading operation itself functions instead of the refreshing operation. As a matter of fact, however, some of the held data may sometimes be displayed on a large scale. In this case, it follows that those data which are not displayed are not refreshed.

SUMMARY OF THE INVENTION

It is an object of the present invention to provide a video storage device which is capable of realizing a mode in which a still image is held, such that either addition of further circuits or modification of the present circuitry is hardly required.

It is another object of the invention to provide a video system which is capable of realizing a mode in which a still image is held.

A video storage device according to the invention comprises a memory for storing a plurality of bits of data, an address counter for counting successive clock pulses and for specifying addresses in writing data to the memory, and a still image-holding mode-setting means for establishing a still image-holding mode in which data to be written to the memory is held in the still image-holding mode-setting means. In the still image-holding mode, the address counter serves as a refresh counter that specifies addresses in the memory to refresh it.

According to one aspect of the invention, the memory may comprise a memory array and a register means connected with the memory array via a gate means. In the still image-holding mode, the gate means is disabled to inhibit writing of data from the register means to the memory array. Under this condition, the memory array is accessed in response to counting operation of the address counter.

A video system capable of operating in a still image mode in accordance with the invention comprises a video signal-generating means for producing a video signal, a video display means for displaying a visible image according to the video signal, a memory connected between the video signal-generating means and the video display means and acting to store the video signal, an address counter connected with the memory for counting successive clock pulses and for specifying addresses in writing data to the memory, and a still image mode-setting means for establishing the still image mode in which data to be written to the memory are held in the still image mode-setting means and, at the same time, the memory produces a still image to the video display means. In the still image mode, the address counter serves as a refresh counter that specifies addresses in the memory to refresh it.

Other objects and features of the invention will appear in the course of the description thereof which follows.

DESCRIPTION OF THE PREFERRED EMBODIMENTS

Figure 5:
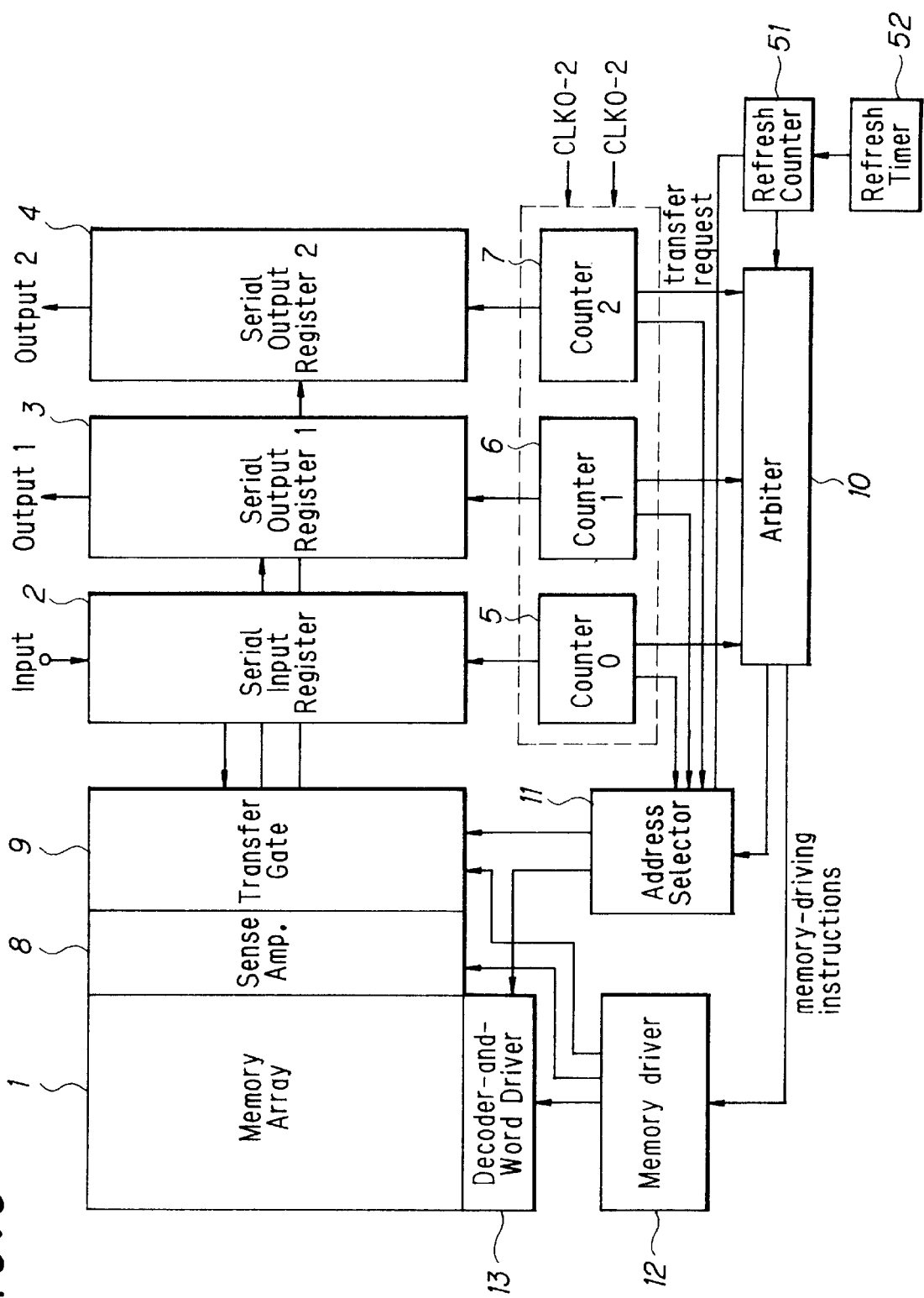
FIG. 5 is a block diagram of a video storage device in accordance wit the present invention.

A video storage device in accordance with present invention is shown in FIG. 5. The device includes a counter 51 used only for refreshing operation. The device also incorporates a refresh timer 52. The refresh counter 51 is operated according to instructions either from the refresh timer 52 or from outside of the device. In this way, the refresh operation is effected.

Figure 1:
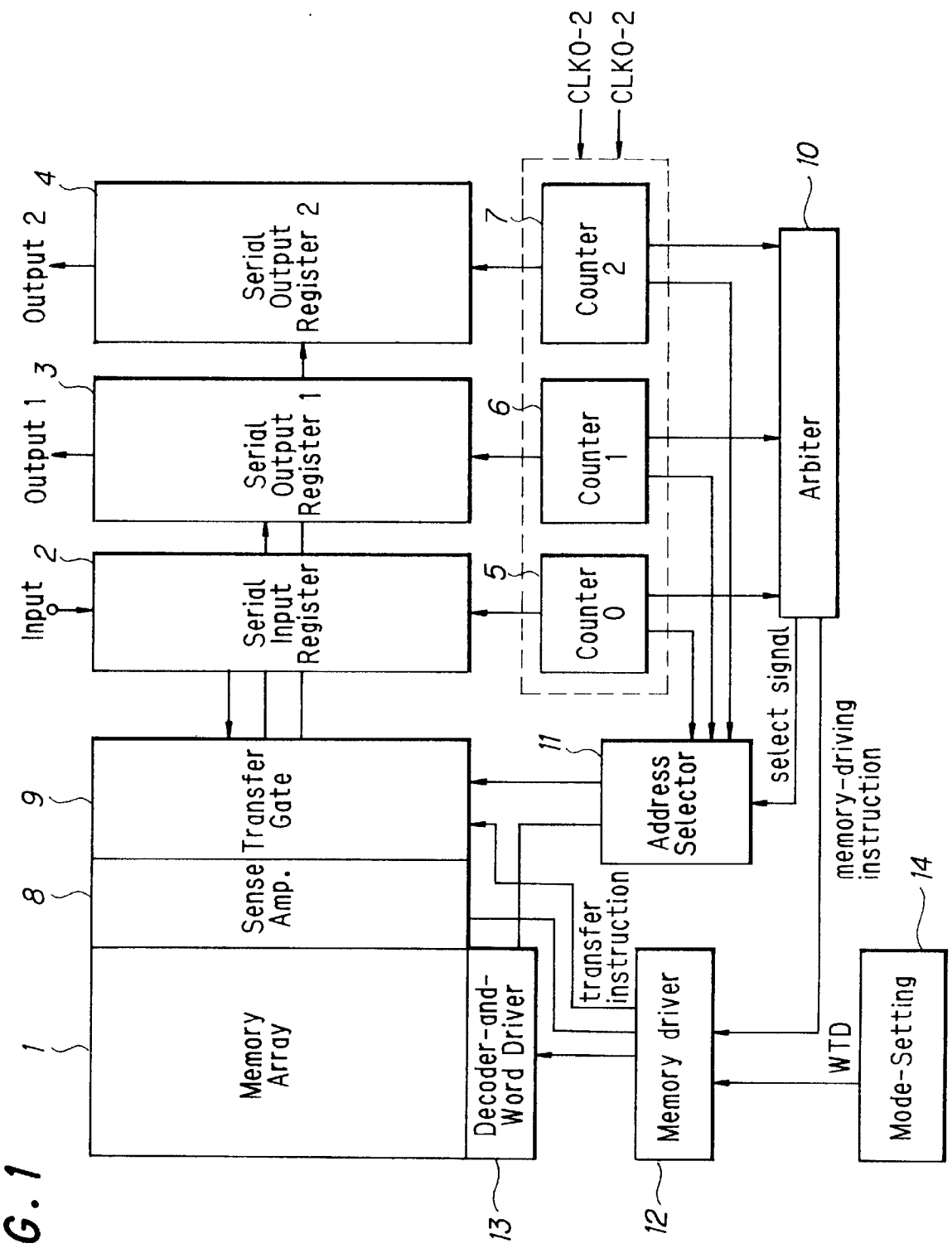
FIG. 1 is a block diagram of a video storage device according to the invention.

Referring now to FIG. 1, there is shown a video storage device embodying the concept of the present invention. This storage device has a serial input-output configuration with three ports. The storage device includes a memory array 1 consisting of a DRAM (dynamic random access memory). One of the three ports is an input, while the remaining two are output 1 and output 2. The storage device further includes a serial input register 2, a first serial output register 37 a second output register 4, and counters 5, 6, and 7. The counter 5 is connected with the serial input register 2. The counter 6 is connected with the first serial output register 3. The counter 7 is connected with the second serial output register 4. Data to be written to this memory array 1 are held in the serial input register 2. Data to be read from this memory array 1 are held in the serial output registers 3 and/or 4. Data about the memory cells of the memory array 1 are read out by a sense amplifier 8. Data are selectively transferred among the memory array 1, the serial input register 2, and the serial output registers 3, and 4 by a transfer gate circuit 9. For example, the gate circuit 9 may be any MOS transistor.

The address counters 5–7 are adapted to count in synchronism with clock signals CLK0–CLK2, respectively, and are cleared by clear signals CLR0–CLR2, respectively. The counters 5–7 produce transfer requests to an arbiter 10 at regular intervals of time to transfer data between the memory array 1 and the counters 5–7. The arbiter 10 orders these requests to circumvent contention. Addresses are selected and memory cells are activated via an address selector 11, a memory driver circuit 12, and a decoder-and-word driver 13 in accordance with the results of the reconciliation made by the arbiter 10. Data are written to and read from the memory array 1 via the serial registers 2–4 of the corresponding ports.

The video storage device is further equipped with a still image-holding mode-setting portion 14 for establishing a still image-holding mode in which data written to the memory array 1 are held as a still image. When the still image-holding mode is established, the still image-holding mode-setting portion 14 produces a write transfer-disabling signal WTD to the memory driver circuit 12. In response to this disabling signal WTD, the memory driver circuit 12 disables the transfer gate circuit 9. At the same time, the address counter 5 for serial input begins to count in response to the disabling signal WTD.

In the operation of the video storage device constructed in this way, when the still image-holding mode-setting portion 14 does not deliver the write transfer-disabling signal WTD, data are written or rewritten exactly in the same way as in the prior art techniques. On the other hand, when the still image-holding mode is established, the transfer gate circuit 9 is disabled by the write transfer-disabling signal WTD delivered from the still image-holding mode-setting portion 14. Concurrently, the address counter 5 for serial input starts to count.

Under this condition, if the whole of the memory array 1 is accessed, using the clock signal CLK0 and the clear signal CLR0, then only writing to the memory array 1 from the serial input register 2 is disabled. Thus, the permitted operation is only that the memory array 1 is refreshed. In this way, the address counter 5 for serial input is directly used also as a counter for refreshing. Consequently, a refreshing operation can be accomplished without the need to add a dedicated refresh counter.

Figure 2:
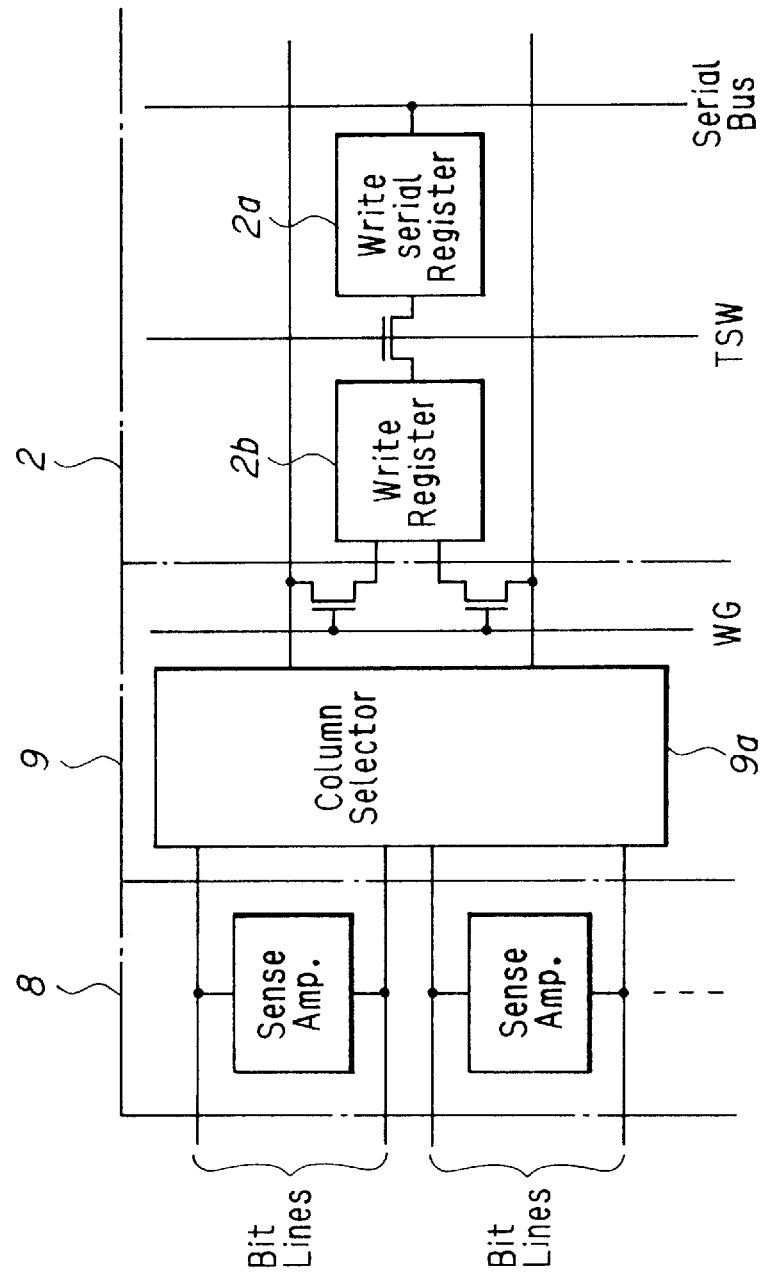
FIG. 2 is a diagram illustrating a specific example of a data-writing system included in the storage device shown in FIG. 1.

FIG. 2 shows an example of the data-writing system of the video storage device shown in FIG. 1. The transfer gate circuit 9 has a column selector 9a for every given number of pairs of bit lines (e.g., 12 pairs). The selector 9a selects one pair of bit lines from these bit line pairs. When a write gate signal WG is at a high level, a writing operation is carried out.

The serial input register 2 is composed of a write serial register 2a and a write register 2b. The write gate signal WG is generated in response to the AND of an inversion of the write transfer-disabling signal WTD and a row address strobe (RAS) signal for the memory array 1. When the disabling signal WTD is at a low level, the write gate signal WG is caused to be high in synchronism with the RAS signal. Under this condition, data are written to the memory array 1. On the other hand, when the disabling signal WTD is at a high level, the write gate signal WG is at a low level, and no writing operation is effected; only a refreshing operation is performed.

Figure 3:
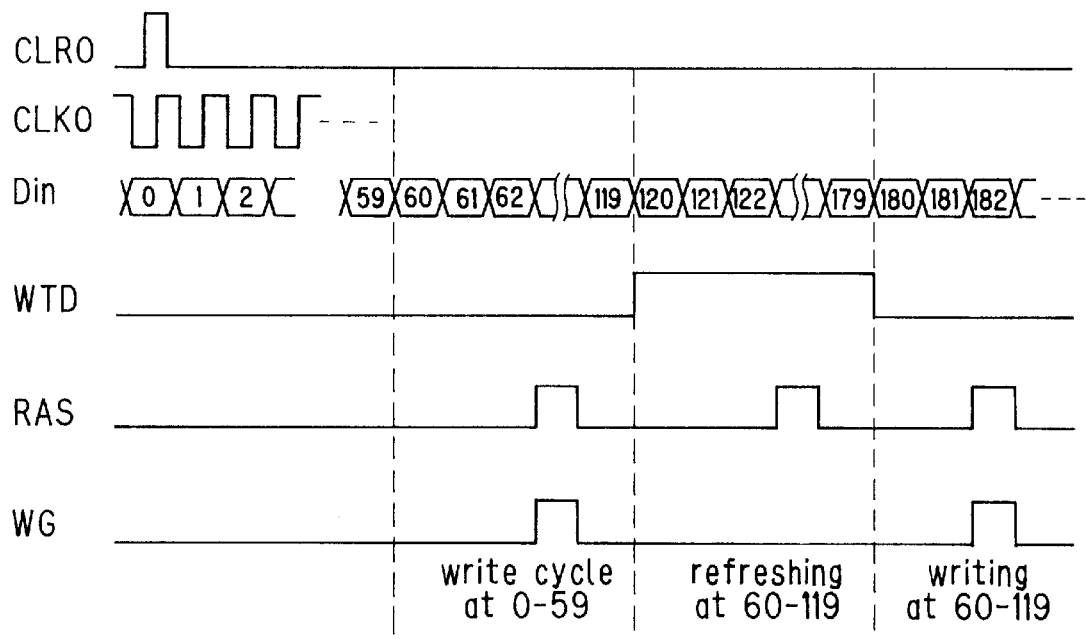
FIG. 3 is a timing chart illustrating the writing operation and the refresh operation of the storage device shown in FIG. 1.

The writing operation and the refreshing operation will be described by referring to the timing chart of FIG. 3. In the present example, it is assumed that whenever 60 bits of data are serially written, data are transferred from the serial input register 2 to the memory array 1. If 60 bits of input data Din are written to the serial input register 2, these 60 bits of data are transmitted to the memory array 1 during the application of the next 60 bits.

At this time, if the still image-holding mode-setting portion 14 establishes the still image-holding mode, then this portion 14 delivers the write transfer-disabling signal WTD of a high level. In response to this, the memory array 1 gains access to an address specified by the serial input address counter 5. However, the transfer gate circuit 9 capable of transferring data from the serial input register 2 to the memory array 1 is kept disabled. As a result, a refreshing operation is carried out at this address. If the whole image is accessed while maintaining the write transfer-disabling signal WTD at a high level, then all the data stored in the memory array 1 are refreshed. Also, it is possible to select either writing of data in units of 60 bits or refreshing of the previous data, by controlling the timing at which the write transfer-disabling signal WTD is delivered.

Figure 4:
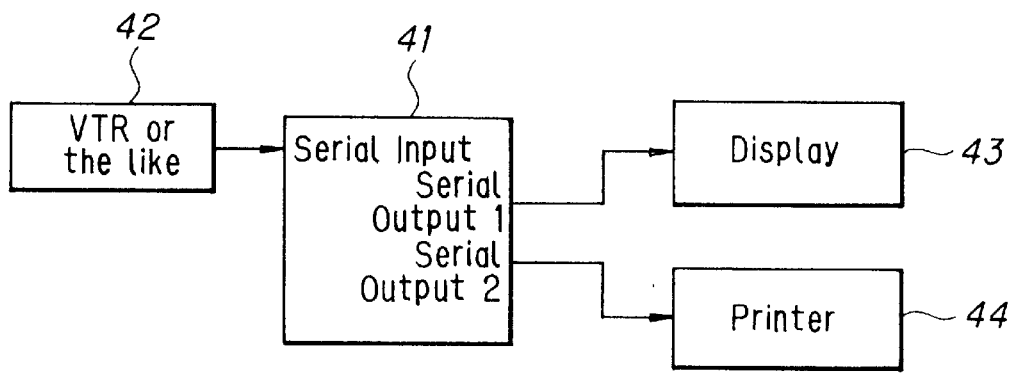
FIG. 4 is a block diagram of a still image reproduction system including a video storage device according to the invention.

A still image reproduction system utilizing a video storage device with three input-output ports according to the invention will be described by referring to FIG. 4. This reproduction system has a video storage device 41 to which a video signal produced from a playback apparatus 42 such as a VTR, a VTR camera and a video disk player or video data representing a TV signal are serially applied. The storage device 41 produces a serial output 1 to a display unit 43, for example, in response to the accepted video data. The video data are made visible on the display unit 43 to permit the user to check the data. The storage device 41 also produces a serial output 2 to a printer 44, for example, to print out the data.

In the above embodiment, the video storage device has three input/output ports. The number of the ports is not limited to three. The invention can also be applied to a video storage device having 2 ports and also to a video storage device having 4 or more ports. Also in the above embodiments, a serial input register is provided independent of serial output registers. Serial registers which can be switched between input registers and output registers may also be employed.

As described thus far, the novel video storage device has a serial input-output configuration. In the still image-holding mode, the transfer gate circuit which selectively permits transfer of data from the serial input register to the memory array is disabled. The memory array is accessed in response to the counting operation of the address counter for the serial input port. Thus, writing of data to the memory array is disabled, and the permitted operation is only that the memory array is refreshed. Hence, the still image-holding mode can be realized with the conventional circuit configuration in such a way that either addition of further circuits or modification of the circuitry is hardly required.

What is claimed is:

1. A video storage device comprising:
    a dynamic memory array for storing a plurality of bits of data;
    register means coupled to said dynamic memory array through gate means, said register means comprising input register means and output register means, said input register means having input terminals to which said data are supplied, said output register means having output terminals to which said data are outputted;
    arbitration means for conciliating transfer operation between said dynamic memory array and said register means and refreshing operation, wherein after data is transferred from said dynamic memory array to said register means, said input register means and said output register means operate independently from said refreshing operation;
    a write address counter for counting successive clock pulses and for specifying addresses in writing data to said memory;
    a still image-holding mode-setting means for establishing a still image-holding mode in which data stored in said memory is held; and
    wherein said write address counter serves as a refresh counter that specifies addresses in said memory to refresh it in said still image-holding mode.

2. A video storage device according to claim 1, wherein said register means serially accepts said data.

3. A video storage device according to claim 1, wherein said gate means comprises MIS transistors.

4. A memory device comprising;
a dynamic memory array for storing a plurality of bits of data;
a serial input register coupled to said memory array;
register means coupled to said dynamic memory array through a transfer gate, said register means comprising input register means and output register means, said input register means having input terminals to which said data are supplied, said output register means having output terminals to which said data are outputted;
a word driver for driving said memory array;
a memory driver for driving said transfer gate and said word driver;
a counter for said input register;
an address selector coupled between said counter and said transfer gate;
arbitration means for conciliating transfer operation between said dynamic memory array and said register means and refreshing operation, wherein after data is transferred from said dynamic memory array to said register means, said input register means and said output register means operate independently from said refreshing operation; and
holding mode-setting means for generating a write transfer-disable signal and providing it to said memory driver thereby to disable said transfer gate, and driving said counter for said input register thereby to specify addresses in said memory array to refresh it.

* * * * *